United States Patent [19]

Horvath

[11] Patent Number: 4,479,140

[45] Date of Patent: Oct. 23, 1984

[54] THERMAL CONDUCTION ELEMENT FOR CONDUCTING HEAT FROM SEMICONDUCTOR DEVICES TO A COLD PLATE

[75] Inventor: Joseph L. Horvath, Poughkeepsie, N.Y.

[73] Assignee: International Business Machines Corporation, Armonk, N.Y.

[21] Appl. No.: 392,918

[22] Filed: Jun. 28, 1982

[51] Int. Cl.³ ..................... H01L 23/36; H01L 23/40
[52] U.S. Cl. ....................................... 357/81; 357/82; 357/79
[58] Field of Search ............................ 357/81, 82, 79

[56] References Cited

U.S. PATENT DOCUMENTS

| | | | |
|---|---|---|---|
| 3,315,136 | 4/1967 | Lob | 357/79 |
| 3,449,642 | 6/1969 | Ortner et al. | 357/79 X |
| 3,717,797 | 2/1973 | Rydeski | 357/79 |
| 3,896,544 | 7/1975 | Fosnough | 357/79 X |
| 3,996,447 | 12/1976 | Bouffard et al. | 357/79 |
| 4,093,971 | 6/1978 | Chu et al. | 357/81 X |
| 4,235,285 | 11/1980 | Johnson et al. | 357/79 X |
| 4,263,965 | 4/1981 | Mansuria et al. | 357/82 X |

FOREIGN PATENT DOCUMENTS 1564243 12/1969 Fed. Rep. of Germany ........ 357/79

OTHER PUBLICATIONS

"Semiconductor Module with Improved Air Cooling," Zirnis–IBM Tech. Disclosure Bulletin, vol. 20, No. 5, Oct. 1977, p. 1768.
IBM TDB, vol. 20, No. 11A, Apr. 1978, p. 4336.
IBM TDB, vol. 21, No. 3, Aug. 1978, p. 1141.

Primary Examiner—Andrew J. James
Assistant Examiner—S. V. Clark
Attorney, Agent, or Firm—Wolmar J. Stoffel

[57] ABSTRACT

A thermal bridge element for use in a semiconductor package to conduct heat from a semiconductor device to a cold plate or cover positioned in close proximity to the bridge element has an axially compressible spring member with a bulged central portion, a first flat plate member adapted to be placed in contact with the device, a second flat plate member adapted to be disposed in contact with the cold plate or cover, and a means to maintain the spring member, the first plate member and the second plate member in operative engagement.

11 Claims, 2 Drawing Figures

THERMAL CONDUCTION ELEMENT FOR CONDUCTING HEAT FROM SEMICONDUCTOR DEVICES TO A COLD PLATE

TECHNICAL FIELD

My invention relates to techniques and structure for the dissipation of thermal energy generated by semiconductor devices. More particularly, the present invention relates to conduction elements for cooling semiconductor devices in single device or multi-device integrated circuit package assemblies where the devices are mounted on substrates with solder bonds, and the heat sinks or covers are mounted in close proximity to the back sides of the devices.

High circuit densities in modern integrated circuit semiconductor devices require that the heat generated by their operation be efficiently removed in order to maintain the temperature of the devices within limits that will keep the operating parameters of the devices within predetermined ranges, and also prevent destruction of the device by overheating. The problems associated with heat removal are increased when the device is connected to the supporting substrate with solder terminals that electrically connect the device to appropriate terminals on the substrate. On such solder bonded devices, the heat transfer that can be accomplished through the solder bonds is limited, as compared to back bonded devices. Cooling of the semiconductor devices can be achieved by immersing the devices in a suitable liquid coolant. However, these cooling techniques can result in corrosion of the device and substrate metallurgy and also present problems if the package must be reworked. Cooling can also be achieved by providing a heat conductive link of material such as cooling pistons or spring elements, between the device and the cap or cold plate. These elements must be capable of consistently forming and maintaining a good interface contact between the element and the device and cooling plate over as large an area as possible in order to maintain a low thermal resistance. With cooling pistons, forming and maintaining such interface contact is difficult because the devices may be tilted, resulting in an unsatisfactory point or line contact. In general, cooling pistons must be used in an atmosphere of inert gases with a higher heat conductivity than air, or a grease or other conformal means be provided at the piston end—device interface. Another disadvantage is that the pistons may subject the devices being cooled to shock when the package is subjected to inertial forces. Spring-like elements for thermal conduction between the device and cold plate are known. Flat or leaf springs can be positioned between the device and cooling plate or cap for the conduction of heat. However, the generally limited area interface contact between tthe device and the spring element and the spring element and heat sink or cap results in relatively high thermal resistance that seriously reduce the efficiency of the cooling operation. If solder is used to improve the interface contacts, the ends of the spring elements become rigidly joined making the spring member very rigid. This situation is potentially harmful since extreme stress may be applied to the device during temperature fluctuations which may break it. Also, the rigid spring may withdraw from a surface to thereby materially reduce the cooling capability.

What is desired in the semiconductor packaging technology is an inexpensive, resilient, dependable, thermal bridge element capable of accommodating dimensional variations and non-parellel surface contacts between a device and cap or cold plate that has a low thermal resistance. Further, the element should be simple to install, and to permit disassembly for rework operations if such are necessary.

BACKGROUND ART

The following prior art references relate to various structures for removing heat from solder bonded semiconductor devices. U.S. Pat. No. 3,993,123 discloses a semiconductor package in which a movable heat conductive piston is placed in contact with the back side of a solder bonded semiconductor device to conduct heat away from a device to a cooling plate. U.S. Pat. Nos. 4,034,468 and 4,081,825 both disclose semiconductor packages where a low melting point solder is provided in contact with the back side of a solder bonded device and a module cap to remove heat from the device. U.S. Pat. No. 4,156,458 discloses a cooling arrangement including a resilient heat conductive metallic foil bundle extending between the back side of a device and the heat sink. IBM Technical Disclosure Bulletin Vol. 21 No. 3 Aug. 21, 1978 P. 1141 discloses a thermal shunt element disposed between a solder bonded semiconductor device and a module cap comprised of a rectangular center portion and a pair of divergent wings that contact the cap. IBM Technical Disclosure Bulletin Vol. 20 No. Nov. 6, 1977 P. 2214 and U.S. Pat. No. 4,146,458 disclose a plurality of preform sheets of aluminum foil nested together and disposed between solder bonded semiconductor devices and a housing to remove heat from the device. IBM Technical Disclosure Bulletin Vol. 19 No. May 12, 1977 P. 4683 discloses a thermal conduction bridge between a solder bonded semiconductor device and a cap that features a plurality of interleaved relatively slidable fins. Application Ser. No. 249,262 filed Mar. 30, 1981, assigned to the same assignee of this application discloses a thermal bridge for conducting heat from a device to a cover which includes a relatively thick metal sheet provided with cuts that define at least one tab element. U.S. application Ser. No. 291,218 filed Feb. 19, 1981, assigned to the same assignee as this application, discloses a thermal bridge element consisting of a bulged disc of resilient heat conductive material provided with radial slots emanating from a central point and terminating short of the outside edge and a second plurality of spaced radial slots located between the first plurality of radial slots in alternating relation and extending from the edge inwardly terminating short of the center of the disk.

SUMMARY OF THE INVENTION

This invention is a thermal bridge element for use in a semiconductor package to conduct heat from a semiconductor device mounted on a substrate to a cold plate or cap in close proximity to the device, the bridge having an axially compressible large area spring member provided with a bulged central portion, a first flat plate member adapted to be disposed in contact with the back side of the device, the means to join the first plate to the bulged portion of the spring member, a second flat plate member adapted to be disposed in contact with the cold plate or cap, and a means to maintain the spring member and second plate member in operative engagement.

BRIEF DESCRIPTION OF THE DRAWINGS

The details of my invention will be described in connection with the accompanying drawing in which.

BRIEF DESCRIPTION OF PREFERRED EMBODIMENT

Figure 1:
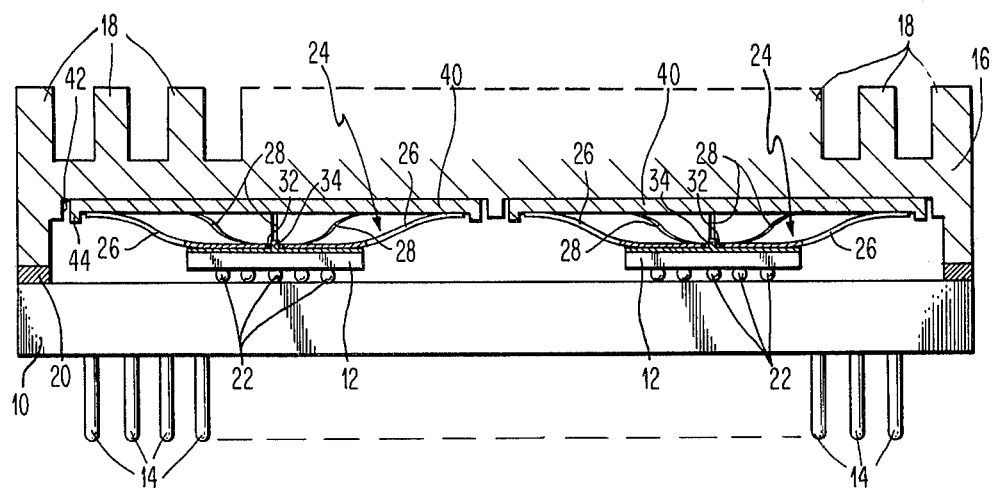
FIG. 1 is an elevational view in section and in greatly enlarged scale illustrating a semiconductor package and the thermal bridge element of the invention as used therein.
Figure 2:
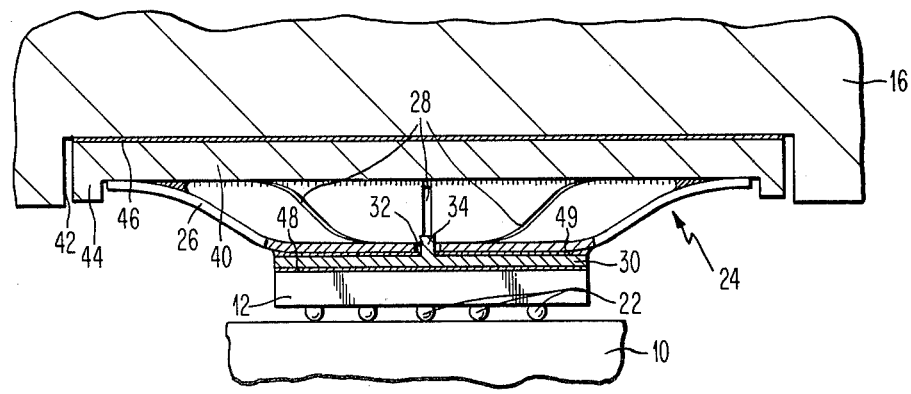
FIG. 2 is an elevational view in section in greatly enlarged scale illustrating the details of the thermal bridge element of my invention and its association with the semiconductor device and cap.

Referring now to the Figs. of the drawing which depict a preferred specific embodiment of my invention, there is illustrated a semiconductor package made up of a substrate 10 with a metallurgy pattern within or on the top surface of the substrate that interconnects devices 12 mounted thereon and pins 14 extending from the bottom surface. A typical finned cap 16, provided with fins 18, is secured to substrate 10 by a braze seal 20. The devices 12 are electrically connected to the metallurgy system on or within the substrate 10 by solder interconnections 22. In operation, the devices 12 generate heat which must be dissipated by heat conduction through solder bonds 22, and preferably some type of thermal interconnection to conduct heat from the back side of the device to the cap or heat sink. In this invention, the heat is removed from the device to the overlying cap 16 by thermal bridge elements 24. The thermal bridge element 24 has an axially compressible large area spring member 26 provided with a bulged central portion. Spring member 26 can be of any suitable shape i.e., circular, square, rectangular, etc. Preferably slots 28 are provided to make the spring more flexible. Spring member 26 is formed of a metal or material having a high thermal conductivity, preferably a copper alloy that is predominantly copper but includes a metal that makes the material more springlike. Spring element 26 can have any suitable thickness, preferably in the range of 0.008 to 0.010 inches. A flat plate 30 is disposed in contact with the back side of device 12. Plate 30 can be provided with a centrally located projection 32 located in aperture 34 in spring member 26 in order to maintain the spring member and plate in aligned relation. Plate 30 is formed of a heat conductive material, as for example copper, which is preferably solder wettable. The thickness of plate 30 can be of any suitable thickness typically on the order of 0.020 inches. An upper flat plate member 40 is disposed in contact with the cover 16 which is made of heat conductive material, as for example copper. As indicated in FIGS. 1 and 2, the cover can be provided with a recess 42 to accept upper plate 40. Preferably the plate 40 has a solder wettable surface and is also provided with a means to locate the spring member 26 relative to the plate. As indicated in FIGS. 1 and 2, a peripheral flange 44 can be provided to locate the member 26. Suitable clearance is provided between the edge of the spring member 26 and the inner surface of the flange to allow the spring to expand and contract.

As previously mentioned, the surface of spring member 26 is preferably made non-wettable to solder while the surfaces of plates 30 and 40 are solder wettable. Preferably a coating of solder 46 is provided on the top side of plate 40 as well as a coating on the under side. The coating can be any suitable thickness, typically in the range of 0.001 to 0.005 inches. Coatings 48 and 49 are also preferably provided on the top and bottom surfaces of plate 30. When the members of the thermal bridged element of my invention are assembled and the cap 16 joined to the substrate 10, the assembly is subjected to a heating step in order to melt the solder seal 20. At this time the solder coatings on the bridge element are also melted. When the package assembly is cooled, the solder solidifies thereby bonding the upper plate 40 to the surface of the cap 16. The coatings on the lower plate 30 solidify forming an intimately contacting interface between the device and the spring element 26. In like manner, the solder coating on the underside of plate 40 solidifies but does not adhere to spring element 26 since it is non-wettable to solder. By this arrangement the spring element 26 remains free to flex slightly when the elements of the package expand and contract due to temperature fluctuations caused by operation of the device 12. However, the good interface contact provided between the spring element 26 and the solidified solder at both the lower plate 30 and the upper plate 40 assure low thermal resistance at the interface. Thus heat generated by the device during operation is effectively conducted away from the device to the overlying cap or heat sink.

It is understood that various changes in the thermal bridge element of our invention and its association with the overlying cap or heat sink can be made without departing from the spirit of the invention.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

I claim:

1. A thermal bridge element for use in a semiconductor package to conduct heat from a semiconductor device mounted on a substrate to a cold plate in close proximity to the device comprising
    a generally annular shaped spring member provided with a compressible bulged first central portion
    a first flat plate member adapted to be disposed in contact with the back side of said device,
    a means to join said first plate to said bulged first central portion of said spring member,
    a second flat plate member adapted to be disposed in contact with said cold plate, and
    a means to join said spring member and second plate member in contacting engagement.

2. The bridge element of claim 1 wherein a coating of solder is provided at least on the interface between said spring member and said first plate member, and at least on the interface between said spring member and said second plate member.

3. The bridge element of claim 1 wherein said first plate member and said second plate members are formed of solder wettable metal,
    a coating layer of solder is provided on said first and said second members, and the surface of said spring member is unwettable to solder.

4. The bridge element of claim 3 wherein said first and second plate members are formed of Cu.

5. The bridge member of claim 3 wherein said spring member is formed of an alloy that includes Cu, and has a surface oxide layer that renders the surface non-solderable.

6. The bridge element of claim 3 wherein said coating layer of solder has a thickness in the range of 0.001–0.005 inches with a melting point in the range of 100°–200° C.

7. The bridge element of claim 2 wherein a coating of solder is provided on the face of said first plate member that is adapted to be in contact with the device.

8. The bridge element of claim 1 wherein said spring member is annular in shape with a bulged first central portion, and said means to join said first plate to said spring member is a projection received in an aperture in the bulged first central portion of said spring member.

9. The bridge element of claim 8 wherein said means to maintain said spring member and second plate member in contacting engagement is a flange on said second plate member.

10. The bridge element of claim 9 wherein clearance is provided between said flange and the edge of said spring member allowing for flexure.

11. The bridge element of claim 10 wherein said spring member is provided with radially outwardly extending slots to decrease the force necessary to produce flexure.

* * * * *